United States Patent
Widerin

(10) Patent No.: US 7,425,850 B2
(45) Date of Patent: Sep. 16, 2008

(54) QUADRATURE DIVIDER

(75) Inventor: Peter Widerin, Hoerbranz (AT)

(73) Assignee: NewLogic Technologies GmbH, Lustenau (AT)

( * ) Notice: Subject to any disclaimer, the term of this patent is extended or adjusted under 35 U.S.C. 154(b) by 125 days.

(21) Appl. No.: 11/428,873

(22) Filed: Jul. 6, 2006

(65) Prior Publication Data

US 2007/0009077 A1  Jan. 11, 2007

(30) Foreign Application Priority Data

Jul. 9, 2005  (DE)  ........................ 10 2005 032 229

(51) Int. Cl.
*H03B 19/00* (2006.01)
(52) U.S. Cl. ...................................... 327/117; 327/115
(58) Field of Classification Search ................. 327/115, 327/117, 118
See application file for complete search history.

(56) References Cited

U.S. PATENT DOCUMENTS 6,583,674 B2 * 6/2003 Melava et al. ................. 331/16
6,831,489 B2 * 12/2004 Cheung et al. ............... 327/115
7,095,353 B2 * 8/2006 Sander et al. ................ 341/157
7,298,183 B2 * 11/2007 Mirzaei et al. ............... 327/115
2002/0039894 A1 * 4/2002 Yoshida et al. .............. 455/265
2007/0024329 A1 * 2/2007 Heidari et al. ............... 327/115

OTHER PUBLICATIONS

Yang, Lixin, et al.: "A Non-Feedback Multiphase Clock Generator", IEEE International Symposium on Circuits and Systems, ISCAS 2002.

* cited by examiner

*Primary Examiner*—N. Drew Richards
*Assistant Examiner*—William Hernandez
(74) *Attorney, Agent, or Firm*—Baker & Daniels LLP

(57) ABSTRACT

The quadrature divider comprises a plurality of flip-flops, including at least a first flip flop and an endmost flip-flop, interoperably coupled in series to produce a predetermined dividing ratio, wherein each of the plurality of flip-flops includes differential inputs, differential outputs and differential clock inputs, the outputs of one flip-flop are connected to the corresponding inputs of a subsequent flip-flop, the outputs of the endmost flip-flop are connected inversely to the inputs of the first flip-flop, wherein the flip-flops are clocked at their clock inputs with differential clock signals in a consecutive manner which, for each flip-flop and depending on the dividing ratio, are individually selected from quadrature clock input signals.

15 Claims, 7 Drawing Sheets

QUADRATURE DIVIDER

FIELD OF THE INVENTION

The present invention relates to a quadrature divider, in particular a quadrature divider for the use in a radio frequency (RF) synthesizer.

BACKGROUND OF THE INVENTION

RF dividers are one of the crucial building blocks in RF PLLs since they operate at the speed of the RF oscillator. Typically RF dividers are done by an even number of synchronous D-flip-flops clocked with the same differential signal. This allows to obtain frequency dividers with an even numbered division factor n and 2n equidistant phases. Particularly, the phase of quadrature output signals (differential I/Q) is important. This quadrature phases are obtained by a synchronous divide-by-2 circuit with 4 outputs. For odd division factors these structures cannot be used.

RF dividers based on synchronous flip-flops are well known. They consist of a chain of a number of n flip-flops clocked with opposite signals. The resulting output has 2n signals at equidistant phases with 1/n th of the input frequency. A typical standard RF flip-flop for this purpose is shown in FIG. 1. (In the literature exist many variations of this structure e.g. the PMOS load can be replaced by a resistor.) The flip-flop has two differential clock inputs C,$\overline{C}$, two differential inputs I,$\overline{I}$, and two differential outputs O,$\overline{O}$. The clock inputs are sensitive to the rising edge of a clock input signal.

The switching behavior of this flip-flop is shown in the following table 1.

TABLE 1

| I | $\overline{I}$ | C | $\overline{C}$ | $O_n$ | $\overline{O}_n$ |
|---|---|---|---|---|---|
| 1 | 0 | ⌐ |   | 1 | 0 |
| 1 | 0 |   | ⌐ | $O_{n-1}$ | $\overline{O}_{n-1}$ |
| 0 | 1 | ⌐ |   | 0 | 1 |
| 0 | 1 |   | ⌐ | $O_{n-1}$ | $\overline{O}_{n-1}$ |

The flip-flop is set and reset by the rising clock edge. A prior art divide-by-2 circuit based on these flip-flops is shown in FIG. 2. These kind of architectures allows to make even number dividers only. Therefore the 2n outputs of these divide-by-n circuits always contains quadrature phases.

It is known in the art to obtain a quadrature signal at 1/3n of the input frequency by using a regenerative divider (see below) in combination with a conventional divider, see e.g.:

U.S. Pat. No. 6,785,528: "Quadrature Divider"; quadrature divider done as a regenerative divider allowing for division factors of M/(M±1).

WO 2004064246: "Regenerative Divider for Up and Down Conversion of Radio Frequency (RF) Signals"; regenerative divider allowing for up conversion by a factor of 4/3.

The possibility to obtain a quadrature signal at fractions of the input signal by using regenerative dividers is known and possible (see e.g. references cited above). In the case of a desired quadrature signal at 1/3 of the input frequency, this architecture requires the use of a divide-by-2 circuit in the feedback loop of the divider in order to get a signal at 2/3 of the input signal and another divide-by-2 circuit at the output in order to get 1/3 of this frequency.

Since regenerative dividers are basically mixers where the output frequency is fed back (divided by an integer) to the second mixer input, they always produce two mixing products (lower and higher sideband). Therefore it is necessary to remove the unwanted sideband to get only one frequency at the output. This can be done by using single sideband mixers, which require an I and a Q signal at both inputs and the output of the mixers, by using a notch or low pass filter in the mixer output or by using a poly-phase filter in the feedback path. Due to the use of mixers and filters, many of the regenerative dividers operate with sinusoidal outputs.

Therefore the outputs are relatively sensitive to jitter produced by noise (as opposed to pulses with steep slopes). Moreover they often operate at relatively small amplitudes which makes them sensitive to noise (low signal to noise ratio).

DISCLOSURE OF THE INVENTION

It is the object of the present invention to propose a quadrature divider without the drawbacks of prior art dividers with respect to division factor, number of output phases, and noise sensitivity.

This object is achieved by providing a quadrature divider as described in the independent claim.

Other features which are considered to be characteristic for the invention are set forth in the dependent claims, which are incorporated here for reference.

The quadrature divider comprises a plurality of flip-flops, including at least a first flip flop and an endmost flip-flop, interoperably coupled in series to produce a predetermined dividing ratio, wherein each of the plurality of flip-flops includes differential inputs, differential outputs and differential clock inputs, the outputs of one flip-flop are connected to the corresponding inputs of a subsequent flip-flop, the outputs of the endmost flip-flop are connected inversely to the inputs of the first flip-flop, wherein the flip-flops are clocked at their clock inputs with differential clock signals in a consecutive manner which, for each flip-flop and depending on the dividing ratio, are individually selected from quadrature clock input signals.

The present invention proposes RF dividers without the above mentioned limitations on division factor and number of output phases. The invention relates to even number and odd number dividers. The concept uses all four phases of a quadrature input clock signal to clock a loop of synchronous RF-flip-flops. Therefore it is possible to obtain divide-by-n circuits with 4n phases at the outputs. Particularly simple quadrature dividers are disclosed having division factors at multiples of 3 and quadrature output signals. However, also any prime number divider with quadrature output phases can be designed according to the invention.

The innovation requires the use of a quadrature oscillator or any other mechanism which provides an input frequency in four equidistant phases.

According to the present invention, the whole division and quadrature generation is done in one single circuit. Hence the proposed divider is much simpler and therefore easier to design than the regenerative dividers known in the art. The output signals of the proposed divider are square waves, i.e. pulses from rail to rail with steep slopes. Therefore the new design is less sensitive to noise than the previous solutions.

The main advantage in using a quadrature divider in a RF synthesizer instead of only using 2n dividers (as it is done in the literature) is the much higher variety in choosing IF frequencies and offset frequencies for the oscillator (VCO):

An RF system with an output signal at $f_{out}$ could e.g. have an oscillator operating at 3/4 $f_{out}$, i.e. far away from the output frequency. Therefore the oscillator is not sensitive to frequency pulling. The oscillator signal divided-by-3, i.e. at 1/4

$f_{out}$, can then be used to produce $f_{out}$ by means of mixers. In the downconverter, the oscillator signal can be used to downconvert the input to an IF of ¼ $f_{out}$, and one third of the oscillator frequency to mix to the baseband. If for example a divide-by-9 circuit is used, the oscillator can operate at 9/10 $f_{out}$, producing an IF of 1/10 $f_{out}$. In the case e.g. of a WLAN systems this allows to choose an IF at approximately 500 MHz, with an oscillator at 4.5 GHz and an output frequency of approximately 5 GHz.

The dividers proposed according to the present invention allow a dual band architecture for a system with two output bands which are different by a factor 2, i.e., $f_{high}=2f_{low}$, as it is e.g. required for 802.11g radios (2.5 GHz and 5 GHz). An oscillator operating at f_osc=(f_high+f_low)/2 together with a quadrature divider-by-3 is used to mix (by means of single sideband mixers) to ⅔ f_osc=f_low (i.e. Lower sideband) and to 4/3 f_osc=f_high (i.e. Higher sideband).

Exemplary embodiments of the invention are described in more detail below on the basis of the drawings. Further characteristics, advantages and applications of the invention can be derived from the drawings and their description.

DETAILED DESCRIPTION OF EXEMPLARY EMBODIMENTS OF THE INVENTION

Figure 1:
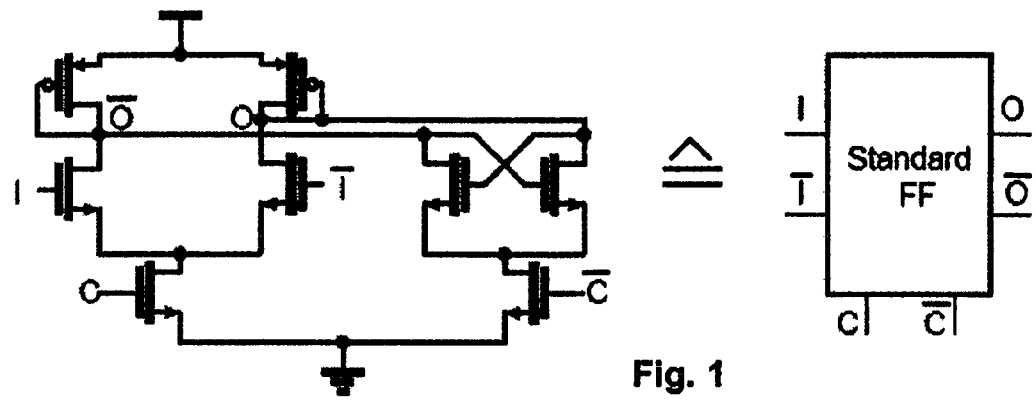
FIG. 1: A single standard RF flip-flop (Prior Art). The schematic represented in the following by the symbol on the right hand side.
Figure 2:
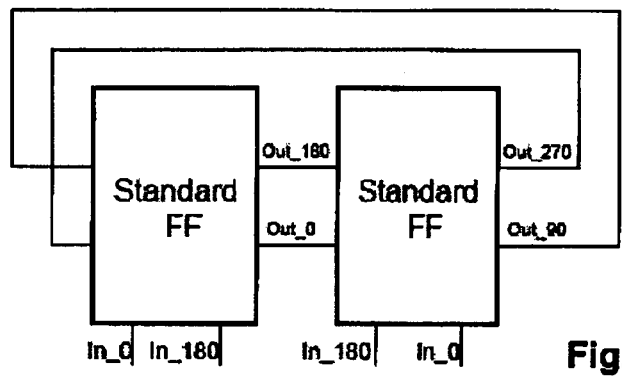
FIG. 2: A divide-by-2 circuit with 4 output phases (Prior Art).

In order to get dividers-by-n with 4n phases, we need a quadrature input signal. Using all the four input signals allows to double the output phases with respect to the prior art flip-flop-based dividers. For even division factors the most general divide-by-n circuits with 4n phases is obtained by connecting a number of 2n standard flip-flops in a loop as it is done with differential ring oscillators (see Prior Art FIGS. 1 and 2).

The two outputs O,Ō of one flip-flop are connected to the corresponding inputs I,Ī of the subsequent flip-flop, respectively. The outputs O,Ō of the endmost flip-flop are connected inversely to the inputs I,Ī of the first flip-flop, respectively. The flip-flops are clocked at their clock inputs C,C̄ with differential clock signals in a consecutive manner. The clock signals are provided by a quadrature oscillator, having at least four quadrature outputs with equidistant phases, e.g. at 0°, 90°, 180°, and 270°. The two differential clock signals input to each flip-flop are individually selected from the quadrature outputs In_0, In_90, In_180, and In_270 of the quadrature oscillator.

Figure 3:
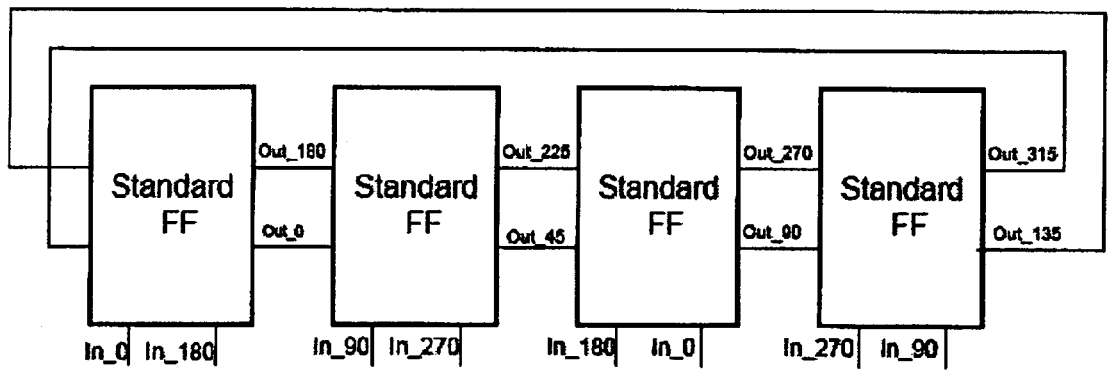
FIG. 3 is a block diagram of a quadrature divide-by-2 circuit: The signals In_x represent the input frequencies with relative phases as indicated in the index x. The signals Out_x are the outputs at half of the input frequency in eight equidistant phases as indicated in the index x.

FIG. 3 shows a divide-by-2 circuit comprising four identical flip flops and having 8 (=4n) equidistant phase outputs. This circuit requires twice as much flip-flops as the prior art divide-by-2 circuit of FIG. 2.

Figure 4:
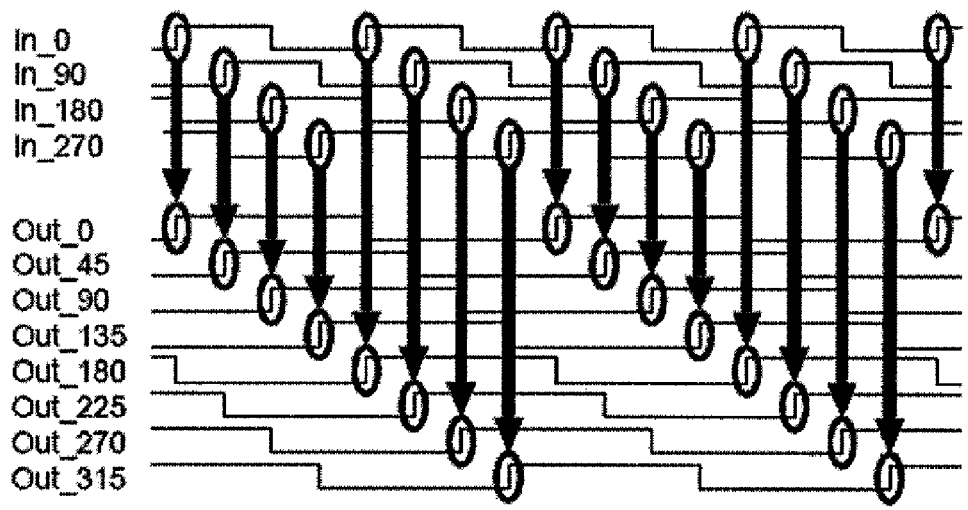
FIG. 4 is a switching diagram (time chart) of the quadrature divide-by-2 circuit of FIG. 3: In_x represents the input frequencies with relative phase as indicated in the index. Out_x are the outputs at half of the input frequency in eight equidistant phases as indicated in the index.

The functionality of the circuit of FIG. 3 becomes clear by looking at the switching behavior shown in FIG. 4. The input signals coming from a quadrature oscillator in all four phases are denoted by In_0, In_90, In_180, and In_270. The eight output signals of the flip-flops at half of the input frequency are Out_0, Out_45, Out_90, Out_135, Out_180, Out_225, Out_270, and Out_315.

Figure 5:
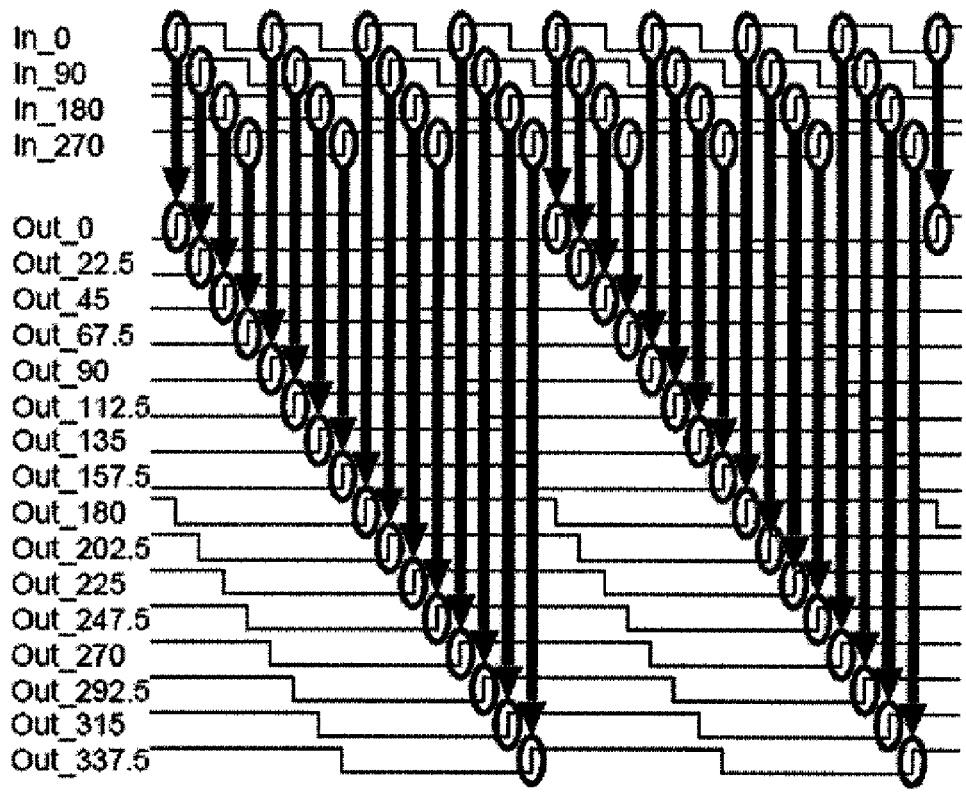
FIG. 5 is a switching diagram of a quadrature divide-by-4 circuit: In_x represents the input frequencies with relative phase as indicated in the index. Out_x are the output signals at a quarter of the input frequency in sixteen equidistant phases.

It is now straight forward to generalize this concept to design a even number divide-by-n circuit with 4n equidistant phases. FIG. 5 shows the switching behavior of a divide-by-4 circuit (comprising eight flip-flops) with 16 equidistant output phases.

In the divider according to FIGS. 3-5, the clock inputs of the n-th flip-flop are connected to the clock input signals In_0+(n−1)*90 and In_180+(n−1)*90.

Divide-by-n circuits with odd division factor are a little different. Since we want outputs with 50% duty cycle, the setting and resetting of the flip-flops has to be done with opposite clock signals. Therefore we need an RF flip-flop which is set by the clock input and reset by the inverted clock input.

The switching characteristics of such a flip-flop can be seen in the following table 2:

TABLE 1

| I | $\bar{I}$ | C | $\bar{C}$ | $O_n$ | $\bar{O}_n$ |
|---|---|---|---|---|---|
| 1 | 0 | ⌐ |   | 1 | 0 |
| 1 | 0 |   | ⌐ | $O_{n-1}$ | $\bar{O}_{n-1}$ |
| 0 | 1 | ⌐ |   | $O_{n-1}$ | $\bar{O}_{n-1}$ |
| 0 | 1 |   | ⌐ | 0 | 1 |

Figure 6:
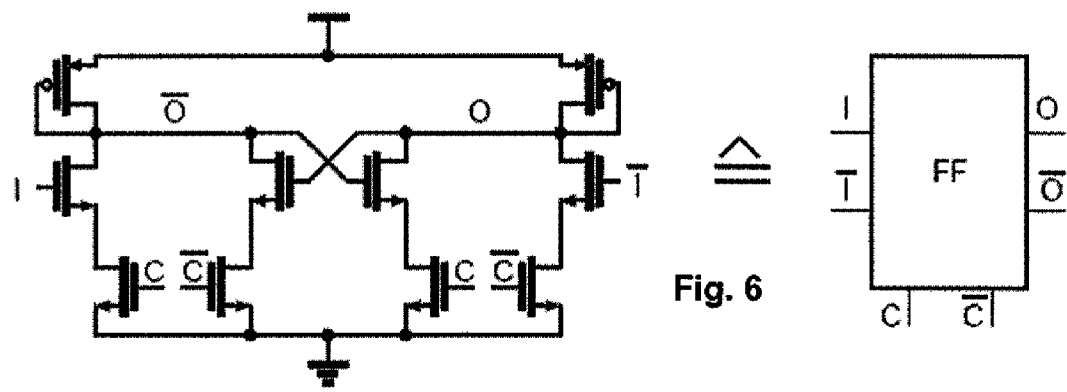
FIG. 6 is a design of a single differential RF FF with a PMOS load connected as a diode. The schematic on the left hand side will be represented in the following by the symbol on the right hand side.

A possible transistor level implementation of this flip-flop is shown in FIG. 6.

Figure 7:
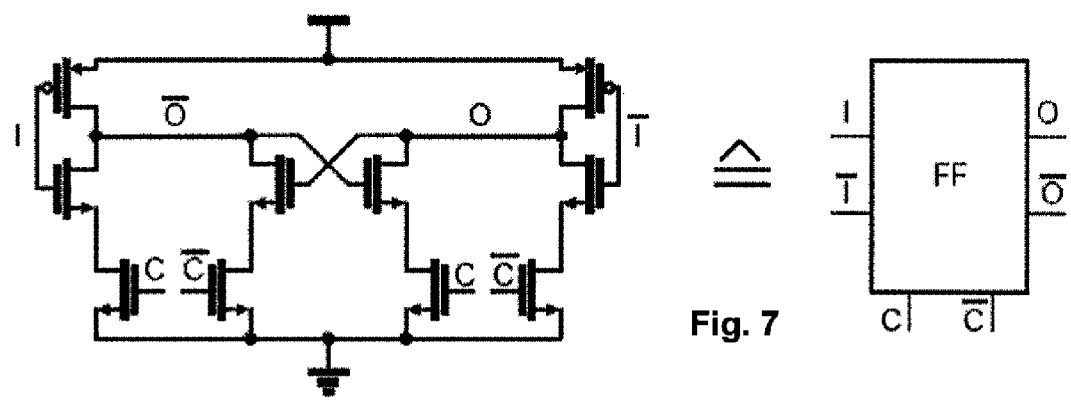
FIG. 7 is a design of single differential RF FF with a switched PMOS load. The schematic on the left hand side will be represented in the following by the symbol on the right hand side.

Another possible implementation is to replace the diode connected PMOS load by a resistor, by a biased PMOS transistor or by an active switched PMOS as it is shown in FIG. 7.

Figure 8:
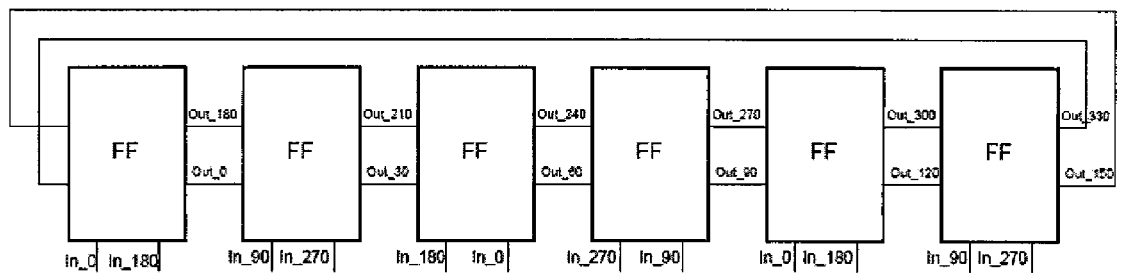
FIG. 8 is a block diagram of a quadrature divide-by-3 circuit with twelve (12) output signals: In_x represents the input frequencies with relative phase as indicated in the index. Out_x are the outputs at a third of the input frequency in twelve equidistant phases.

Using the flip-flops of FIG. 6 or 7, respectively, it is possible to build any odd number divide-by-n circuit with 4n equidistant output phases. As an example, FIG. 8 shows a divide-by-3 circuit with twelve (12) output phases.

Figure 9:
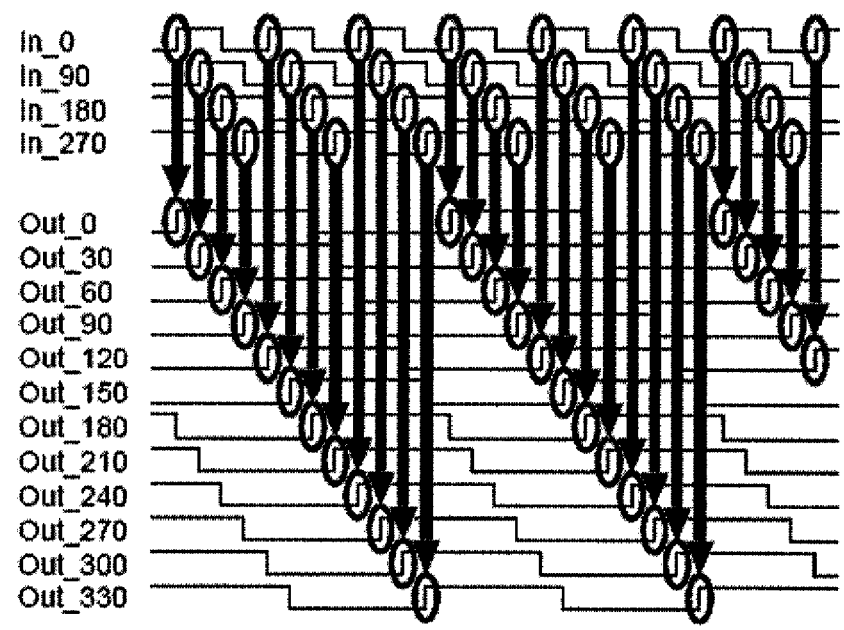
FIG. 9 is a switching diagram of the quadrature divide-by-3 circuit with twelve outputs of FIG. 8: In_x represents the input frequencies with relative phase as indicated in the index. Out_x are the outputs at a third of the input frequency in twelve equidistant phases.

The functionality of this circuit is most easily seen by looking at the switching behavior as shown in FIG. 9. The incoming signals in all four phases are denoted by In_0, In_90, In_180 and In_270. The eight outgoing signals at half of the incoming frequency are denoted by Out_0, Out_45, Out_90, Out_134, Out_180, Out_225, Out_270, and Out_315.

Particularly simple quadrature dividers can be designed if only quadrature outputs are needed. In this cases, the number of flip-flops required for implementing the divider can be reduced which weakens the speed requirements since "less clocks are required". As a general rule, consecutive flip-flops have to be clocked with phases which are less than a full period apart. Since standard dividers only have the differential clock as inputs, this requirement can only be fulfilled if consecutive flip-flops are clocked with opposite sign signals, i.e. 180 degrees phase shifts, which is ½ of the input period length. In the case of quadrature inputs, however, we have three possible input phases, i.e. 90, 180 and 270 degrees, which corresponds to ¼, ½ and ¾ of the input period. Until now, we used a phase shift of ¼ input period between consecutive flip-flops which of course provides the biggest number of output phases. On the other hand this requires very fast flip-flops since there is only a quarter of the input period (i.e. 4 times the input frequency) for each flip-flop to switch. In order to weaken this requirements, it is possible to clock consecutive flip-flops also with phases which are 270 degrees (i.e. ¾ input period length) out of phase, or any mixture of longer and shorter phase differences as we will show below. These simplified quadrature dividers have of course less than 4n output phases. However, since the input signals of all 4 phases are used, the outputs always contain signals in quadrature.

Figure 10:
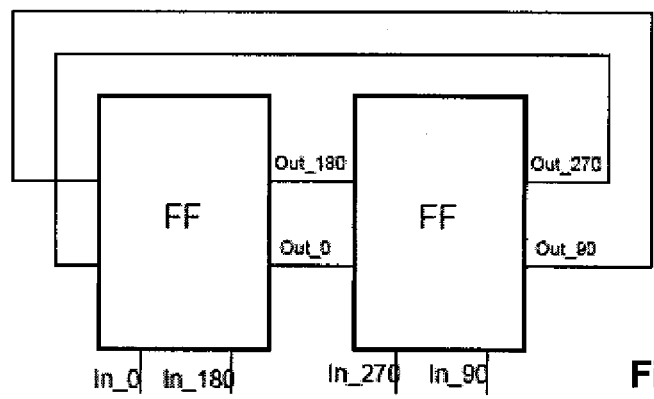
FIG. 10 is a block diagram of a simplified quadrature divide-by-3 circuit with 4 output signals: In_x represents the input frequencies with relative phase as indicated in the index. Out_x are the outputs at a third of the input frequency in four equidistant phases.

In the case of divide-by-3n circuits with quadrature outputs the above concept can be simplified to a number of only 2n flip-flops, e.g. only every third flip-flop is needed, all other flip-flops are omitted. Consecutive flip-flops are then clocked by 270 degree out of phase signals. FIG. 10 shows an example of a divide-by-3 circuit consisting of 2n=2 flip-flops connected in a loop.

Figure 11:
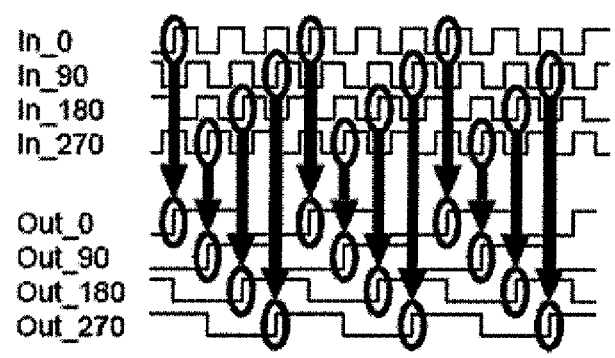
FIG. 11 is a switching diagram of the simplified quadrature divide-by-3 circuit of FIG. 10: In_x represents the input frequencies with relative phase as indicated in the index. Out_x are the outputs at a third of the input frequency in four equidistant phases.

The functionality of this circuit is becomes clear from the switching behavior as shown in FIG. 11. The incoming signals in all four phases are denoted by In_0, In_90, In_180, and In_270. The output signals at a third of the input frequency are Out_0, Out_90, Out_180, and Out_270.

This circuit can now be generalized to other divide-by-3n circuits which produce 4n equidistant phases.

Figure 12:
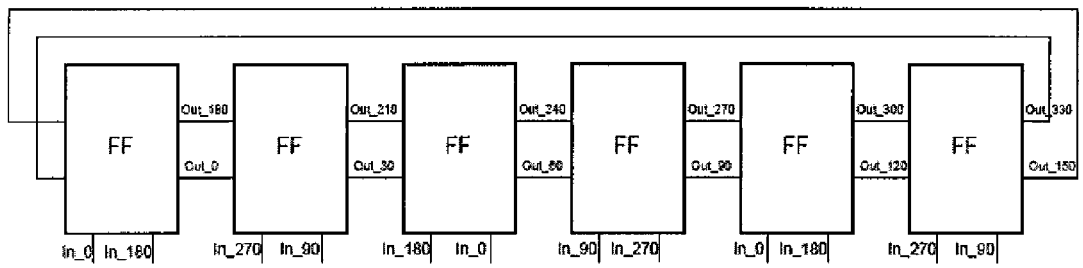
FIG. 12 is a block diagram of a simplified quadrature divide-by-9 circuit: with twelve phase outputs. In_x represents the input frequencies with relative phase as indicated in the index. Out_x are the outputs at a ninth of the input frequency in twelve equidistant phases.

FIG. 12 shows a divide-by-9 circuit consisting of 2n=6 flip-flops connected in a loop, producing 12 equidistant phases.

Figure 13:
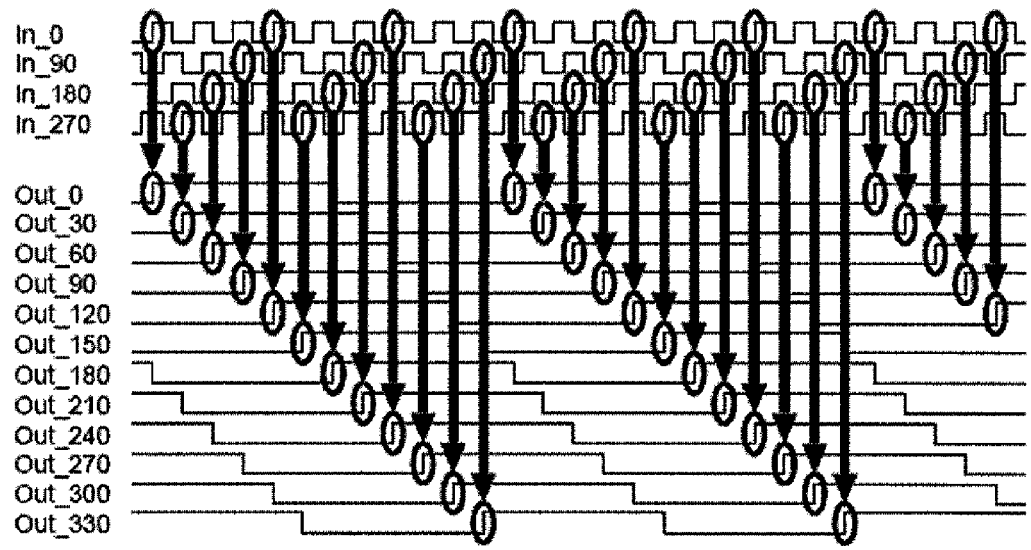
FIG. 13 is a switching diagram of the simplified quadrature divide-by-9 circuit of FIG. 12: In_x represents the input frequencies with relative phase as indicated in the index. Out_x are the outputs at a ninth of the input frequency in twelve equidistant phases.

The functionality of this circuit is most easily seen by looking at the switching behavior as shown in FIG. 13. The input signals in all four phases are denoted by In_0, In_90, In_180, and In_270. The outgoing signals at a ninth of the input frequency are Out_0, Out_30, Out_60, Out_90, Out_120, Out_150, Out_180, Out_210, Out_240, Out_270, Out_300, and Out_330.

In the dividers of FIGS. 6-9, the clock inputs of the n-th flip-flop are connected to the clock input signals In_0+(n−1) *270 and In__180+(n−1)*270.

The circuits presented so far are fully symmetric and have equidistant phases between the output signals, with a correct duty cycle of 50% (regardless process variations and layout asymmetries).

For dividers with prime number division factors n>=5 (e.g. 5, 7, 11, 13, . . . ) and quadrature outputs this symmetry cannot be kept for all the outputs. However, the symmetry and the duty cycle for the quadrature outputs at 0°, 90°, 180° and 270° are correct. The prime number division factors are build up by choosing the correct input phases for consecutive flip-flops. Since the input signal is available in four equidistant phases of 0°, 90°, 180° and 270°, the input phase shift at the clock inputs can be ¼, 2/4 or ¾ of the input period length of 360°. Appropriate adding of these phase shifts gives the required division factor, e.g. divide-by-5 requires a division factor of 5/4, which is 2/4+¾. A divide-by-7 circuit requires a division factor of 7/4=2/4+¾+2/4 and so on for other prime numbers.

Figure 14:
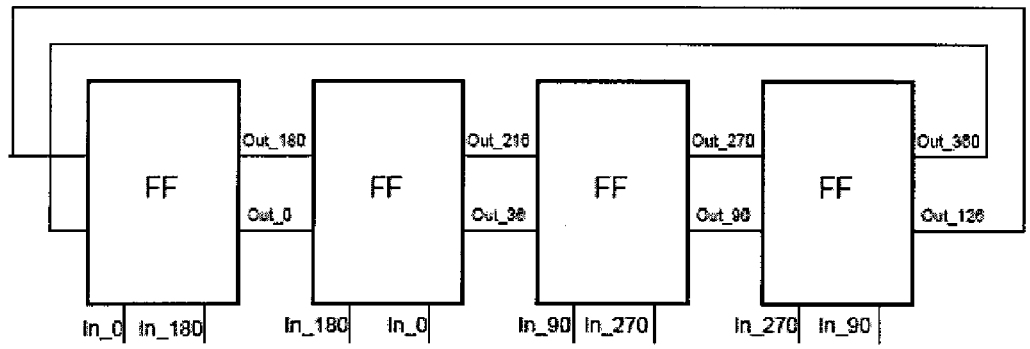
FIG. 14 is a block diagram of a simplified quadrature divide-by-5 circuit with eight phase outputs: In_x represents the input frequencies with relative phase as indicated in the index. Out_x are the outputs at a fifth of the input frequency.

FIG. 14 shows an example of a divide-by-5 circuit with quadrature outputs, consisting of 4 flip-flops.

Figure 15:
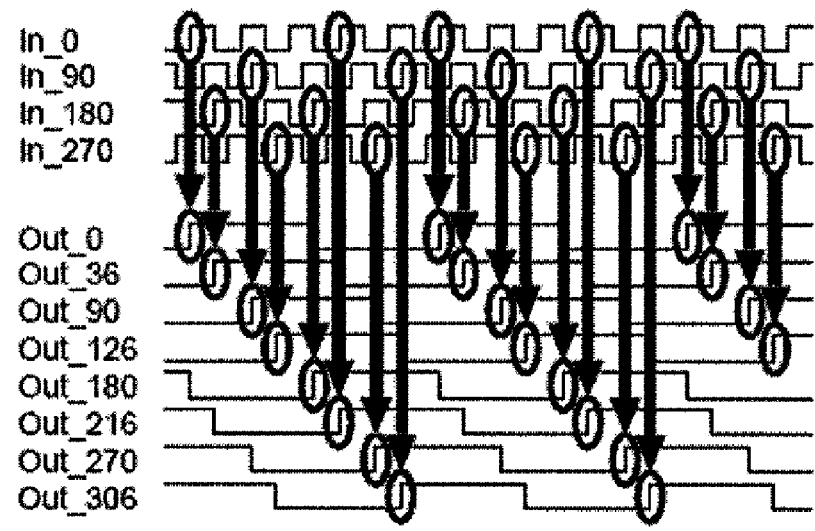
FIG. 15 is a switching diagram of the simplified quadrature divide-by-5 circuit of FIG. 14: In_x represents the input frequencies with relative phase as indicated in the index. Out_x are the outputs at a fifth of the input frequency. The quadrature phases Out_0 Out_90, Out_180, and Out_270 are correct with the correct duty cycle.

The functionality of this circuit is most easily seen by looking at the switching behavior shown in FIG. 15. The input signals in all four phases are denoted by In_0, In_90, In_180, and In_270. The output quadrature signals at a fifth of the input frequency are Out_0, Out_90, Out_180, and Out_270.

Figure 16:
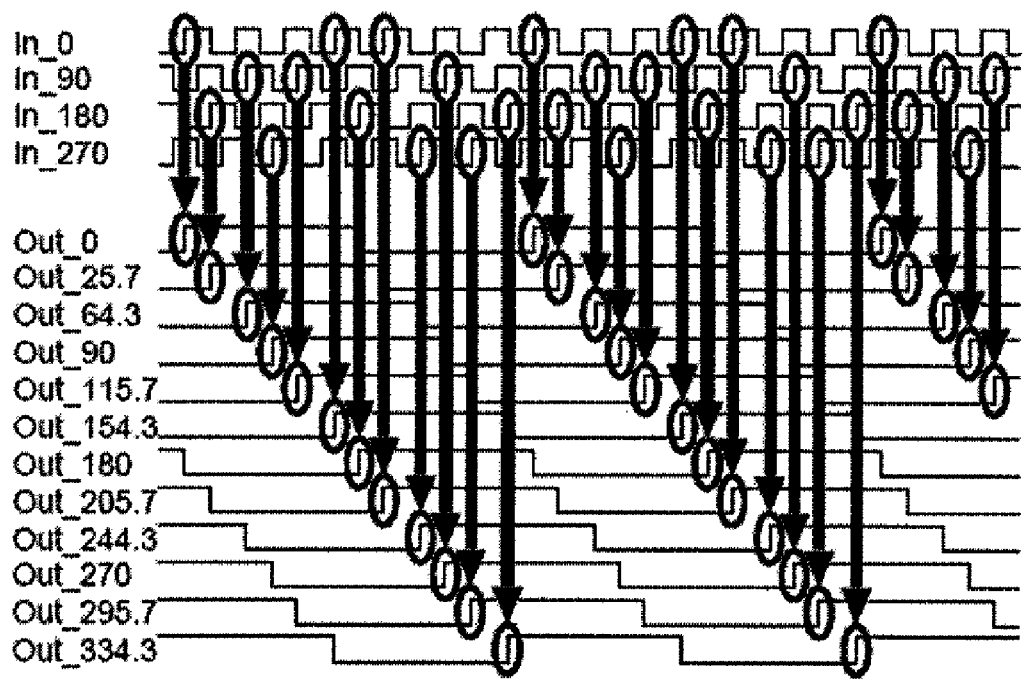
FIG. 16 is a switching diagram of a simplified quadrature divide-by-7 circuit with twelve outputs: In_x represents the input frequencies with relative phase as indicated in the index. Out_x are the outputs at a seventh of the input frequency. The quadrature phases Out_0, Out_90, Out_180, and Out_270 are correct with the correct duty cycle.

FIG. 16 shows the switching behavior of a divide-by-7 prime number divider with quadrature outputs. The input signals in all four phases are denoted by In_0, In_90, In_180, and In_270. The output quadrature signals at a seventh of the incoming frequency are Out_0, Out_90, Out_180, and Out_270.

All other division factors can be obtained by applying analogous design rules.

This kind of divider architecture also works with input signals with more than 4 equidistant phases.

Figure 17:
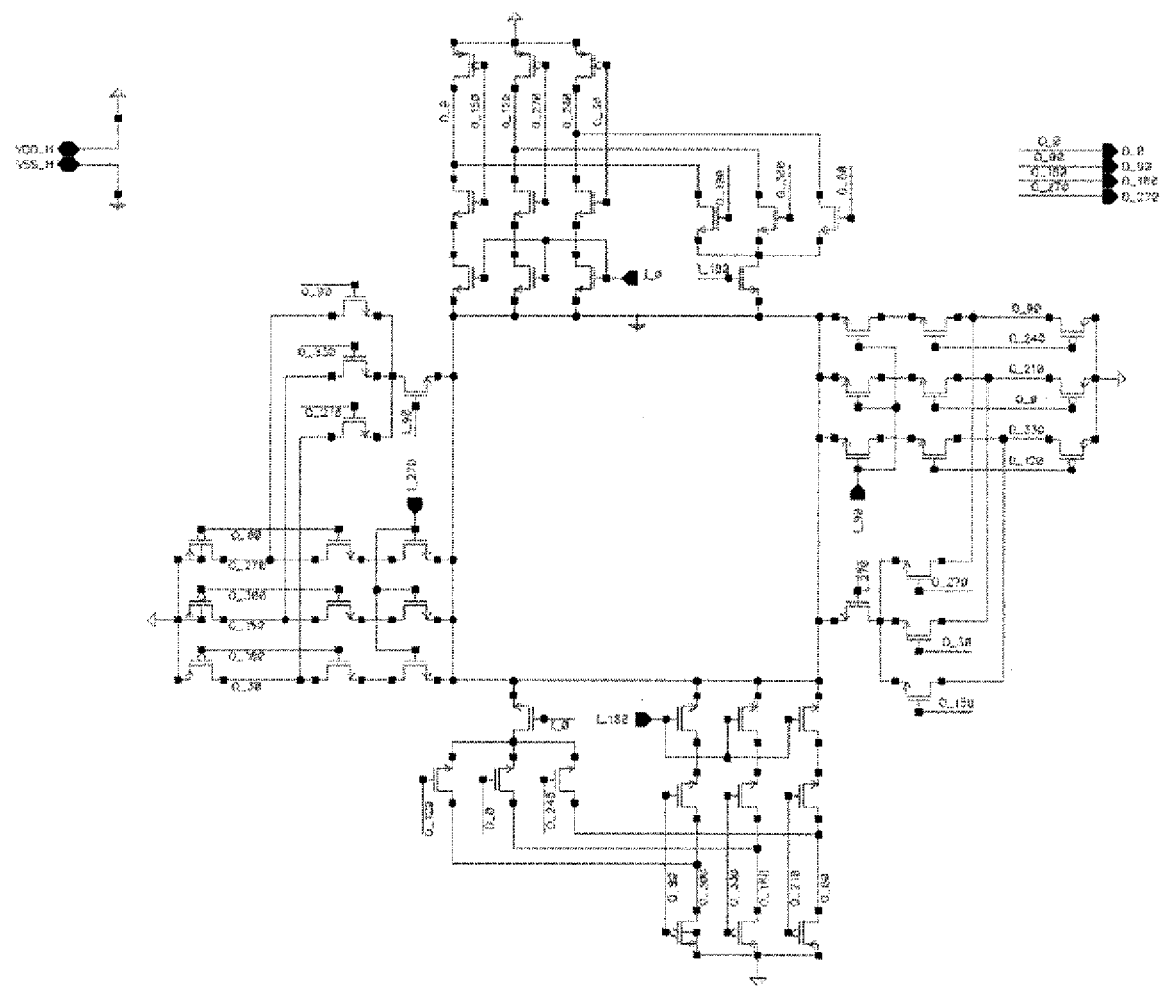
FIG. 17 is a design of the quadrature divide-by-9 circuit of FIG. 12.

In the practical implementation (especially for very high input frequencies) it can be advantageous to contract some of the clock input transistors to one transistor. In this case, the chain of individual flip-flops (used for presentational reasons throughout this document so far) will contract to one relatively complex circuit. In the case of a divide-by-9 circuit with 12 output phases the schematic can look as shown in FIG. 17.

The invention claimed is:

1. A quadrature divider, comprising
a plurality of flip-flops, including at least a first flip-flop and an endmost flip-flop, wherein the flip-flops are interoperably coupled in series to produce a predetermined dividing ratio, wherein each of the plurality of flip-flops includes two differential inputs I,$\bar{I}$, two differential outputs O,$\bar{O}$ and two differential clock inputs C,$\bar{C}$, the outputs O,$\bar{O}$ of one flip-flop are connected to the corresponding inputs I,$\bar{I}$ of a subsequent flip-flop, the outputs O,$\bar{O}$ of the endmost flip-flop are connected inversely to the inputs I,$\bar{I}$ of the first flip-flop, wherein the flip-flops are clocked at their clock inputs C,$\bar{C}$ with differential clock signals in a consecutive manner which, for each flip-flop, are individually selected from quadrature clock input signals, In_0, In_90, In_180, and In_270, wherein the quadrature divider is an even number divide-by-n circuit comprising a number of 2n flip-flops and providing a number of 4n output signals having 4n equidistant phases.

2. The quadrature divider of claim 1, wherein the clock inputs C,$\bar{C}$ of the n-th flip-flop are connected to the clock input signals In_0+(n−1)*90 and In_180+(n−1)*90, respectively.

3. The quadrature divider of claim 1, which comprises flip-flop circuits which are set by a clock input and reset by an inverted clock input.

4. The quadrature divider of claim 1, which comprises flip-flop circuits which are set by a clock input and reset by an inverted clock input.

5. The quadrature divider of claim 3, wherein the quadrature divider is an odd number divide-by-n circuit comprising a number of 2n flip-flops and providing a number of 4n output signals having 4n equidistant phases.

6. The quadrature divider of claim 4, wherein a prime number division factor n is determined by applying a certain clock input phase to each of the consecutive flip-flops.

7. A quadrature divider, comprising a plurality of flip-flops, including at least a first flip-flop and an endmost flip-flop, wherein the flip-flops are interoperably coupled in series to produce a predetermined dividing ratio, wherein each of the plurality of flip-flops includes two differential inputs I,$\bar{I}$, two differential outputs O,$\bar{O}$ and two differential clock inputs C, $\bar{C}$, the outputs O,$\bar{O}$ of one flip-flop are connected to the corresponding inputs I,$\bar{I}$ of a subsequent flip-flop, the outputs O,$\bar{O}$ of the endmost flip-flop are connected inversely to the inputs I,$\bar{I}$ of the first flip-flop, wherein the flip-flops are clocked at their clock inputs C,$\bar{C}$ with differential clock signals in a consecutive manner which, for each flip-flop, are individually selected from quadrature clock input signals, In_0, In_90, In_180, and In_270, wherein the quadrature divider is an odd number divide-by-n circuit comprising a number of 2n flip-flops and providing a number of 4n output signals having 4n equidistant phases.

8. The quadrature divider of claim 7, wherein the clock inputs C,$\bar{C}$ of the n-th flip-flop are connected to the clock input signals In_0+(n−1)*270 and In_180+(n−1)*270, respectively.

9. The quadrature divider of claim 7, which comprises flip-flop circuits which are set by a clock input and reset by an inverted clock input.

10. A quadrature divider, comprising a plurality of flip-flops, including at least a first flip-flop and an endmost flip-flop, wherein the flip-flops are interoperably coupled in series to produce a predetermined dividing ratio, wherein each of the plurality of flip-flops includes two differential inputs I,$\bar{I}$, two differential outputs O,$\bar{O}$ and two differential clock inputs C,$\bar{C}$ the outputs O,$\bar{O}$ of one flip-flop are connected to the corresponding inputs I,$\bar{I}$ of a subsequent flip-flop, the outputs O,$\bar{O}$ of the endmost flip-flop are connected inversely to the inputs I,$\bar{I}$ of the first flip-flop, wherein the flip-flops are clocked at their clock inputs C,$\bar{C}$ with differential clock signals in a consecutive manner which, for each flip-flop, are individually selected from quadrature clock input signals. In_0, In_90, In_180, and In_270, wherein the quadrature divider is an odd number divide-by-3n circuit comprising a number of 2n flip-flops and providing a number of 4n output signals having 4n equidistant phases.

11. The quadrature divider of claim 10, wherein the clock inputs C,$\bar{C}$ of the n-th flip-flop are connected to the clock input signals In_0+(n−1)*270 and In_180+(n−1)*270, respectively.

12. A quadrature divider, comprising a plurality of flip-flops, including at least a first flip-flop and an endmost flip-flop, wherein the flip-flops are interoperably coupled in series to produce a predetermined dividing ratio, wherein each of the plurality of flip-flops includes two differential inputs I,$\bar{I}$, two differential outputs O,$\bar{O}$ and two differential clock inputs C,$\bar{C}$ the outputs O,$\bar{O}$ of one flip-flop are connected to the corresponding inputs I,$\bar{I}$ of a subsequent flip-flop, the outputs O,$\bar{O}$ of the endmost flip-flop are connected inversely to the inputs I,$\bar{I}$ of the first flip-flop, wherein the flip-flops are clocked at their clock inputs C,$\bar{C}$ with differential clock signals in a consecutive manner which, for each flip-flop, are individually selected from quadrature clock input signals, In_0, In_90, In_180, and In_270, wherein the quadrature divider is a prime number divide-by-n circuit, where n>=5, comprising a number of n−1 flip-flops, and providing a number of 2n output signals with at least quadrature output phases of 0°, 90°, 180°, and 270°.

13. The quadrature divider of claim 12, wherein a prime number division factor n is determined by applying a certain clock input phase to each of the consecutive flip-flops.

14. The quadrature divider of claim 12, which comprises flip-flop circuits which are set by a clock input and reset by an inverted clock input.

15. A quadrature divider, comprising a plurality of flip-flops, including at least a first flip-flop and an endmost flip-flop, wherein the flip-flops are interoperably coupled in series to produce a predetermined dividing ratio, wherein each of the plurality of flip-flops includes two differential inputs I,$\bar{I}$, two differential outputs O,$\bar{O}$ and two differential clock inputs C,$\bar{C}$, the outputs O,$\bar{O}$ of one flip-flop are connected to the corresponding inputs I,$\bar{I}$ of a subsequent flip-flop, the outputs O,$\bar{O}$ of the endmost flip-flop are connected inversely to the inputs I,$\bar{I}$ of the first flip-flop, wherein the flip-flops are clocked at their clock inputs C,$\bar{C}$ with differential clock signals in a consecutive manner which, for each flip-flop, are individually selected from quadrature clock input signals, In_0, In_90, In_180, and In_270, wherein the quadrature divider is an odd number divide-by-3n circuit comprising a number of 2n flip-flops and providing a number of 4n output signals having 4n equidistant phases, and wherein the quadrature divider includes flip-flop circuits which are set by a clock input and reset by an inverted clock input.

\* \* \* \* \*